US 6,556,390 B1

(12) United States Patent
Mao et al.

(10) Patent No.: US 6,556,390 B1
(45) Date of Patent: Apr. 29, 2003

(54) SPIN VALVE SENSORS WITH AN OXIDE LAYER UTILIZING ELECTRON SPECULAR SCATTERING EFFECT

(75) Inventors: Sining Mao, Savage, MN (US); Zheng Gao, Minneapolis, MN (US); Jian Chen, Minneapolis, MN (US); Edward Stephens Murdock, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/558,253

(22) Filed: Apr. 25, 2000

(65) Prior Publication Data (65)

Related U.S. Application Data

(60) Provisional application No. 60/162,438, filed on Oct. 28, 1999.

(51) Int. Cl.[7] .................................................. G11B 5/39
(52) U.S. Cl. ............................... 360/324.1; 360/324.11; 360/324.12
(58) Field of Search .................... 360/324.1, 324.11, 360/324.12, 317

(56) References Cited

U.S. PATENT DOCUMENTS

| 5,764,056 | A | | 6/1998 | Mao et al. ................... 324/252 |
| 5,862,021 | A | * | 1/1999 | Deguchi et al. ........ 360/324.11 |
| 5,993,566 | A | | 11/1999 | Lin ............................ 148/108 |
| 6,185,080 | B1 | * | 2/2001 | Gill ........................... 360/324.2 |
| 6,191,926 | B1 | * | 2/2001 | Everitt et al. .......... 360/324.11 |
| 6,208,492 | B1 | * | 3/2001 | Pinarbasi ............... 360/324.11 |
| 6,219,208 | B1 | * | 4/2001 | Gill |
| 6,262,869 | B1 | * | 7/2001 | Lin et al. ................ 360/324.11 |
| 6,275,362 | B1 | * | 8/2001 | Pinarbasi ............... 360/324.12 |
| 6,301,088 | B1 | * | 10/2001 | Nakada .................. 360/324.11 |
| 6,317,298 | B1 | * | 11/2001 | Gill ........................ 360/324.11 |
| 6,348,274 | B1 | * | 2/2002 | Kamiguchi et al. ......... 428/692 |
| 6,353,519 | B2 | * | 3/2002 | Pinarbasi ............... 360/324.11 |
| 6,388,847 | B1 | * | 5/2002 | Horng et al. ........... 360/324.11 |
| 6,407,890 | B1 | * | 6/2002 | Gill ............................ 360/314 |
| 6,473,278 | B1 | * | 10/2002 | Gill ........................ 360/324.12 |

OTHER PUBLICATIONS

Y. Kamichuchi, et al., Digest of Intermag (Korea, May 1999), paper DB–01.
W. F. Egelhoff, et al., J. Appl. Phys. 82, 6142 (1997).
M. J. Carey and A. E. Berkowitz, J. Appl. Phys. 73, 6892 (1993).
H. Sakakima, et. al., J. of Magn. and magn. materials, 198–199 (1999) 9–11.
Y Kawawake, et. al., J. of Appl. Physics vol. 85, No. 8, Apr. 15, 1999, p. 5024.
D. Keavney, et. al., J. of Appl. Physics vol. 86, No. 1, Jul. 1, 1999, p. 476.
H. Swagten, et. al., Physical Review B. vol. 53, No. 14, Apr. 1, 1996–II, p. 9108.
U.S. patent application 09/454,542 filed Dec. 7, 1999.

* cited by examiner

Primary Examiner—Jefferson Evans

(57) ABSTRACT

The present invention comprises a magnetoresistive sensor including a cap layer, a free layer, a spacer layer, a pinned layer, an oxide layer, a pinning layer, a seed layer, and a substrate layer. The sensor consists of the cap layer adjacent the free layer. The free layer is adjacent to the spacer layer. The spacer layer is adjacent to the pinned layer. The pinned layer is adjacent to the oxide layer. The oxide layer is adjacent to the pinning layer. The pinning layer is adjacent to the seed layer and the seed layer is adjacent to the substrate. The present invention also comprises a method of manufacturing the magnetoresistive sensor including forming a layered structure. An electron specular scattering effect occurs at the oxide interface to achieve enhanced GMR responses while maintaining thermostability.

26 Claims, 4 Drawing Sheets

SPIN VALVE SENSORS WITH AN OXIDE LAYER UTILIZING ELECTRON SPECULAR SCATTERING EFFECT

CROSS-REFERENCE TO RELATED APPLICATION(S)

This application claims the benefit of the filing date of U.S. provisional application serial No. 60/162,438 entitled "A Structure to Achieve Thermally Stable Enhanced GMR Responses Utilizing Electron Specular Scattering Effect," which was filed on Oct. 28, 1999.

BACKGROUND

Magnetic sensors utilizing the GMR effect, frequently referred to as "spin-valve" sensors, are known in the art. A spin-valve sensor is typically a sandwiched structure consisting of two ferromagnetic layers separated by a thin non-magnetic spacer layer. One of the ferromagnetic layers is called the "pinned layer" because it is magnetically pinned or oriented in a fixed direction by an adjacent antiferromagnetic layer, commonly referred to as the "pinning layer," through exchange coupling. The other ferromagnetic layer is called the "free" or "unpinned" layer because the magnetization is allowed to rotate in response to the presence of external magnetic fields. In a spin-valve sensor, a change in resistance of a layered magnetic sensor is used to read data from a magnetic medium. This change is attributed to a spin-dependent transport of conduction electrons between the free magnetic layer and one or more pinned magnetic layers through the non-magnetic spacer layers.

Spin-valve sensors benefit from the change of resistance exhibited by the devices, which depends on the relative alignment between the magnetizations of the two ferromagnetic layers. In many practical spin-valve GMR heads, the layers have scattering at the boundaries that limits the size of the GMR. This occurs when the thickness of the layers is comparable with or smaller than the mean free path of the conduction electrons. A conduction electron remembers its spin memory through the sequential spin-dependent scattering in the free-layer, free-layer/spacer interface, spacer/pinned-layer interface and the pinned layer. The more interfaces the electron goes through without being scattered, the larger the GMR value. In the existing spin-valves applications, most of the electrons are scattered after entering the metallic capping layers or antiferromagnetic layer and no longer contribute to the GMR effect.

Specular reflections can be obtained by using insulators as capping layers and antiferromagnetic pinning layers. This enhancement to the GMR has been demonstrated in Co/Cu based spin-valves with NiO as the antiferromagnetic pinning layers. These spin-valves, however, may have disadvantages when used for GMR head applications due to their poor thermal stability.

SUMMARY

In spin valve sensors, improved performance is partly measured by increased sensitivity, which is the ability of the sensor to detect magnetoresistive changes in a magnetic medium. As a result, it is desirable to find ways to improve the sensitivity of spin valve sensors. Consequently, spin valve sensors that respond strongly in the presence of electromagnetic fields are desired.

In general, in one aspect, the invention features a magnetoresistive sensor. The sensor includes a cap layer, a free layer, a spacer layer, a pinned layer, an oxide layer, a pinning layer, a seed layer, and a substrate layer. The sensor consists of the cap layer adjacent to the free layer. The free layer is adjacent to the spacer layer. The spacer layer is adjacent to the pinned layer. The pinned layer is adjacent to the oxide layer. The oxide layer is adjacent to the pinning layer. The pinning layer is adjacent to the seed layer, and the seed layer is adjacent to the substrate. Another aspect of the invention features a method of manufacturing the magnetoresistive sensor. This method includes forming a layered structure. The layered structure includes a cap layer, a free layer, a spacer layer, a pinned layer, an oxide layer, a pinning layer, a seed layer, and a substrate layer.

Implementations may include one or more of the following features. A second pinned layer can be inserted between the oxide layer and the pinning layer. A second free layer adjacent to a second oxide layer can be inserted between the cap layer and the free layer. A Ru layer adjacent to a third pinned layer can be inserted between the second pinned layer and the pinning layer. A second pinning layer, a second oxide layer, and a second pinned layer, each respectively adjacent, can be inserted between the cap layer and the free layer. A second pinning layer, a third pinned layer, a second Ru layer, a fourth pinned layer, a second oxide layer, a fifth pinned layer, and a second spacer layer, each respectively adjacent, can be inserted between the cap layer and the free layer. The free layer can include a bilayer, which is comprised of NiFe and either Co or Fe.

Implementations may include the following advantage. Theoretical calculations show that a 60–100% enhancement to the GMR can be achieved with such implementations of specular reflection.

DETAILED DESCRIPTION

The present invention relates to spin-valve sensors, which in some implementations may relate to a spin-valve sensor with a pinning layer comprising an alloy, such as a Mn-based alloy, and an oxide layer, such as an antiferromagnetic oxide layer, which uses the electron specular scattering effect to achieve enhanced GMR responses while maintaining thermostability.

Figure 1:
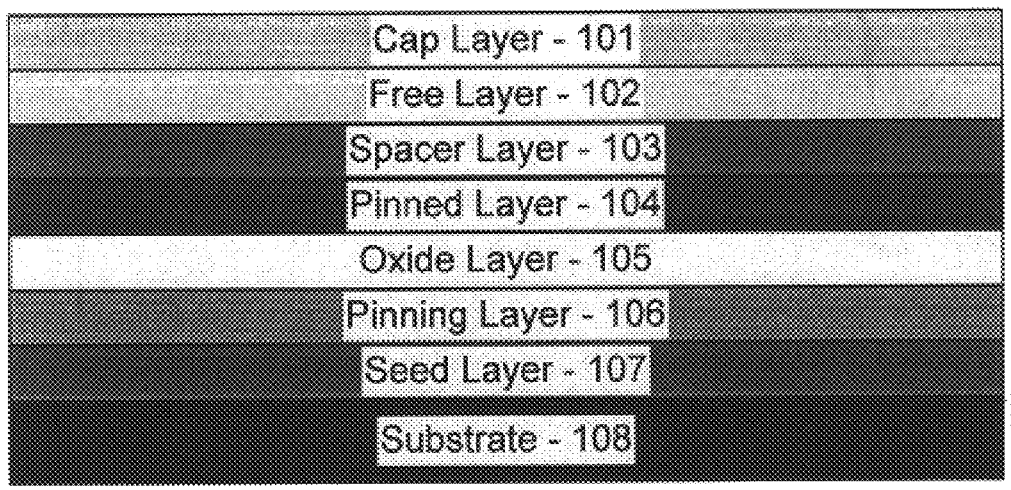
FIG. 1 is a spin-valve read sensor.

FIG. 1 shows a magnetoresistive read head illustrating an implementation of a spin-valve sensor in accordance with the present invention. Spin-valve sensor 100 includes a cap layer 101, a free layer 102, a spacer layer 103, a pinned layer 104, an oxide layer 105, a pinning layer 106, a seed layer 107, and a substrate layer 108. The sensor consists of the cap layer 101 adjacent the free layer 102. The free layer 102 adjacent the spacer layer 103. The spacer layer 103 adjacent the pinned layer 104. The pinned layer 104 adjacent the oxide layer 105. The oxide layer 105 adjacent the pinning layer 106. The pinning layer 106 adjacent the seed layer 107. And the seed layer 107 adjacent the substrate 108.

Implementation of spin-valve sensor 100 may exhibit increased specular reflection at the interface between the free layer 102 and the cap layer 101, and the interface between the pinned layer 104 and the oxide layer 105. The conduction electrons reflected between these interfaces back into the active spin-valve layers (free layer 102, spacer layer 103, and pinned layer 104) retain their spin memory and can re-participate in the spin-dependent scattering sequence. The multi reflections at the interfaces effectively turn the transport properties of a spin-valve into that of a multi-layer that has a larger GMR response.

The spin-valve sensor 100 can be fabricated using PVD methods, such as ion beam sputtering, DC/RF sputtering, and S-gun. The oxide layers can be grown by reactive sputtering or natural oxidation on the sputtered metallic layer. The sputter deposition technique, or other spin-valve manufacturing techniques form a layered structure. The layered structure starts with the forming of the substrate layer 108, followed by the seed layer 107, pinning layer 106, oxide layer 105, pinned layer 104, spacer layer 103, free layer 102, and finally the cap layer 101. The same manufacturing process can be used to form any of the following implementations of the present invention.

Figure 2:
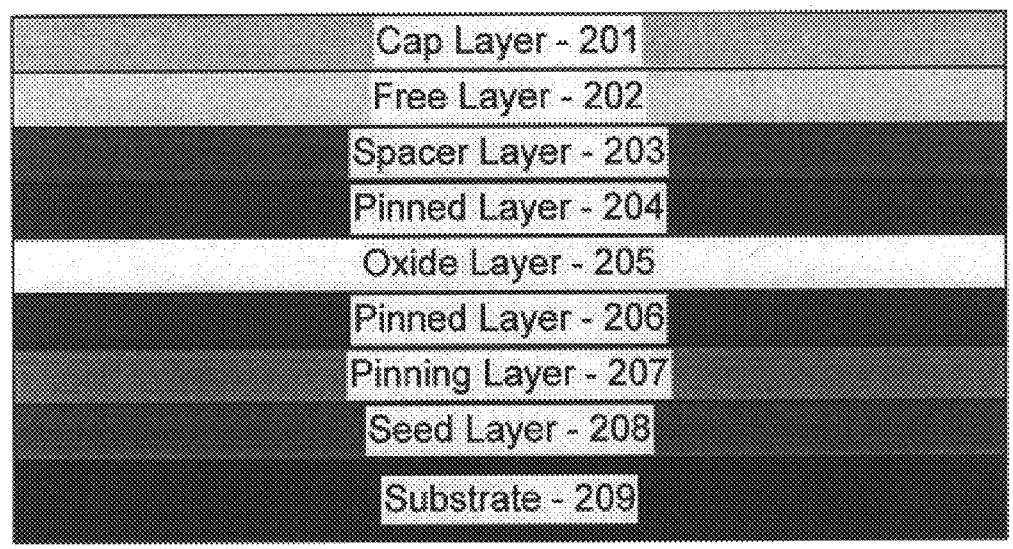
FIG. 2 is a spin-valve read sensor with the oxide layer sandwiched between two pinned layer.

FIG. 2 shows another implementation of a spin-valve sensor 200 in accordance with the present invention. Spin-valve sensor 200 includes a cap layer 201, a free layer 202, a spacer layer 203, a first pinned magnetic layer 204, an oxide layer 205, a second pinned magnetic layer 206, a pinning layer 207, a seed layer 208, and a substrate layer 209. The spin-valve sensor 200 is comprised of substantially the same layers as the spin-valve sensor 100, with the addition of the second pinned layer 206 sandwiched between the oxide layer 205 (oxide layer 105) and the pinning layer 207 (pinning layer 106).

Figure 3:
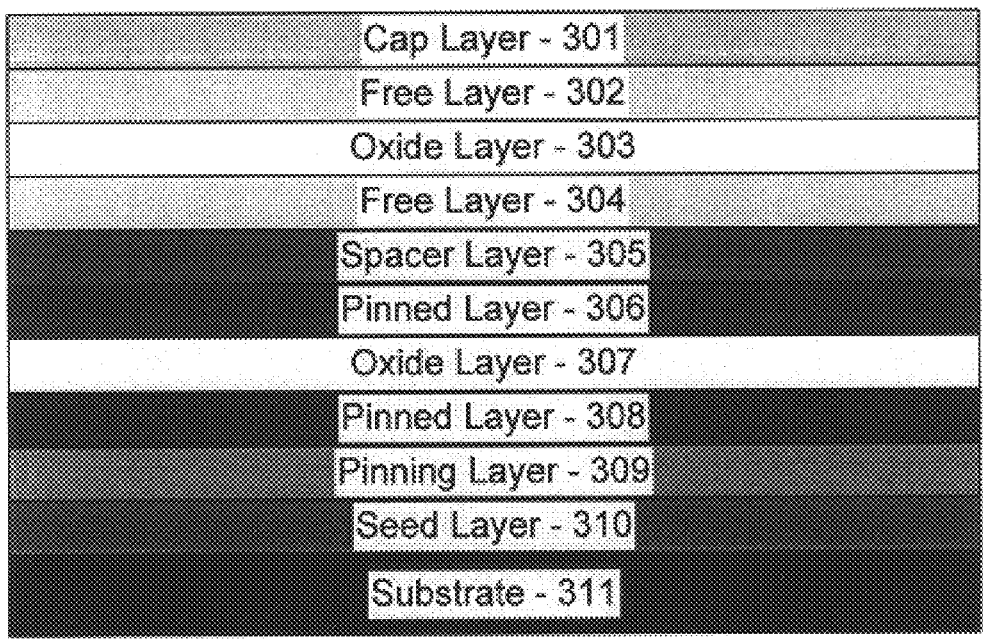
FIG. 3 is a spin-valve read sensor with a second oxide layer.

FIG. 3 shows another implementation of a spin-valve sensor 300 in accordance with the present invention. Spin-valve sensor 300 includes an cap layer 301, a first free layer 302, a second oxide layer 303, a second free layer 304, a spacer layer 305, a first pinned layer 306, a first oxide layer 307, a second pinned layer 308, a pinning layer 309, a seed layer 310, and a substrate layer 311. The spin-valve [200] 300 is comprised of substantially the same layers as the spin-valve sensor 200 with the addition of the first free layer 302 adjacent to the second oxide layer 303, both sandwiched between the cap layer 301 (cap layer 201) and the second free layer 304 (free layer 202).

Figure 4:
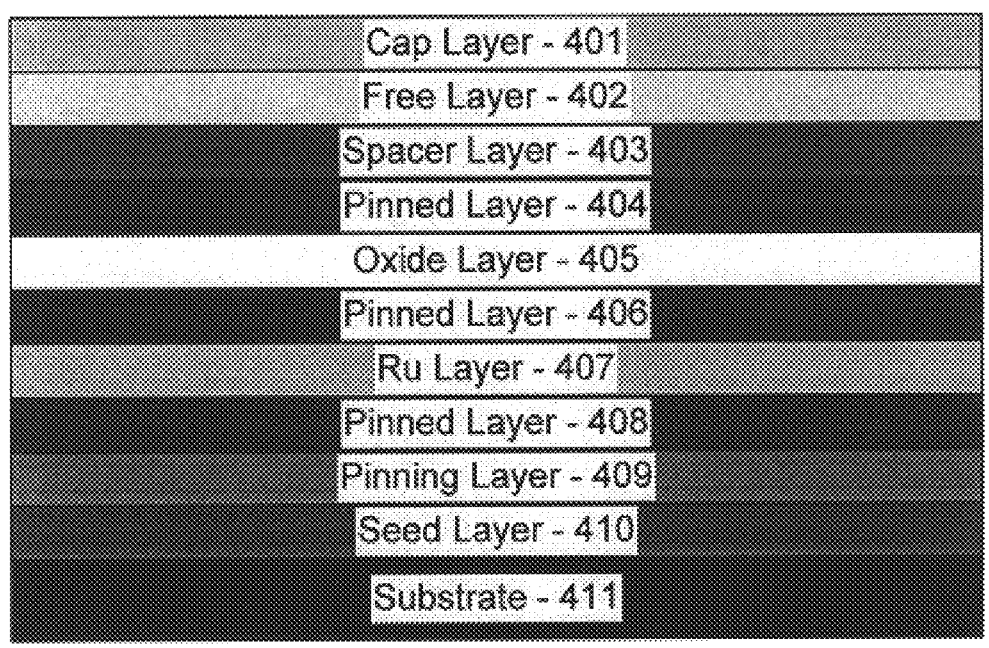
FIG. 4 is a spin-valve read sensor with a synthetic anti-ferromagnetic layer.

FIG. 4 shows an implementation of a spin-valve sensor 400 with synthetic-antiferromagnetic pinned layers in accordance with this invention. Spin-valve sensor 400 includes a cap layer 401, a free layer 402, a spacer layer 403, a first pinned layer 404, an oxide layer 405, a second pinned layer 406, a Ru layer 407, a third pinned layer 408, a pinning layer 409, a seed layer 410, and a substrate 411. The spin-valve 400 is comprised of substantially the same layers as the spin-valve sensor 200 with the addition of the second pinned layer 406 adjacent to the Ru layer 407, both sandwiched between the oxide layer 405 (oxide layer 205) and the third pinned layer 408 (second pinned layer 206).

Special care may need to be taken when applying the techniques of specular reflection to spin-valves with synthetic-antiferromagnetic pinned layers. The Ru layer 407, which mediates a strong antiferromagnetic coupling between the neighboring pinned layers 406 & 408, strongly scatters the conduction electrons. There is also strong scattering of the electrons from the pinned layer 406 next to the pinning layer 409, which has its magnetic moment opposite to the pinned layer 404 next to the spacer layer 403. Therefore, to utilize specular reflection in spin-valves with synthetic antiferromagnetic pinned layers, it is desirable to minimize the conduction electrons entering the Ru layer 407 and the pinned layer 406 next to the antiferromagnetic layer 405. The confinement can be achieved by inserting a thin oxide layer 405 inside the pinned layer 404 next to the spacer layer 403. The conduction electrons can thus travel only within the free layer 402 (which is capped by an oxide layer 401), spacer layer 403, and the pinned layer 404. The thickness and the material of oxide layer inserted inside the pinned layer should probably be chosen such that there is sufficient ferromagnetic coupling of its two neighboring pinned layers.

The same techniques of using specular reflection can be applied to the designs of dual spin-valve sensors. For the case of the simple dual spin-valve, the specular reflection can be achieved by inserting an oxide into the pinned layers as shown in FIG. 5.

Figure 5:
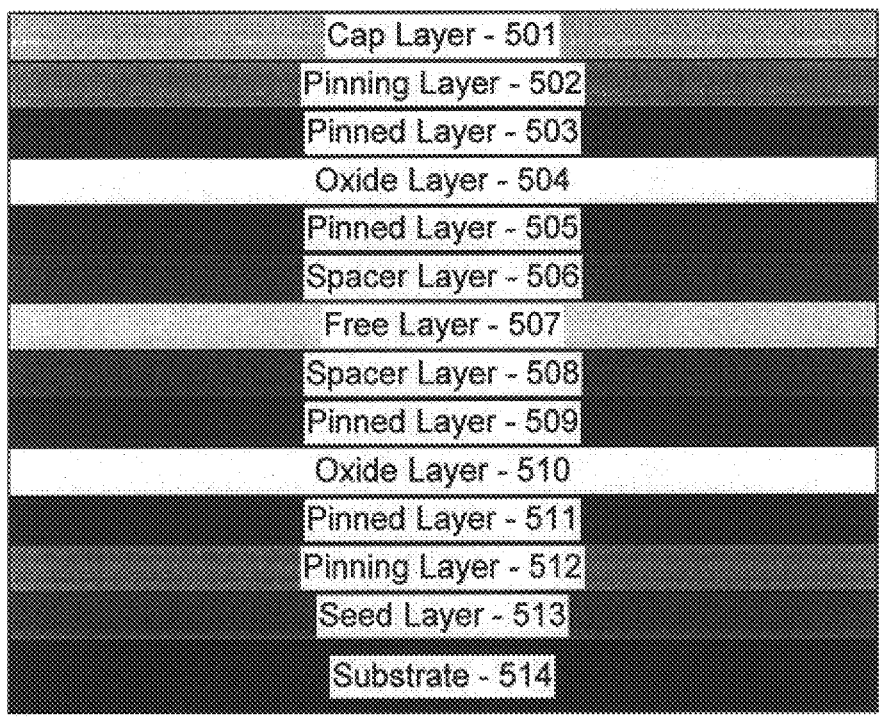
FIG. 5 is a dual spin-valve read sensor.

FIG. 5 shows a magnetoresistive read head illustrating an implementation of a dual spin-valve sensor with an oxide inserted into the pinned layers in accordance with the present invention. Spin-valve sensor 500 includes a cap layer 501, a second pinning layer 502, a forth pinned layer 503, a second oxide layer 504, a third pinned layer 505, a second spacer layer 506, a free layer 507, a first spacer layer 508, a first pinned layer 509, a first oxide layer 510, a second pinned layer 511, a first pinning layer 512, a seed layer 513, and a substrate 514. The spin-valve 500 is comprised of substantially the same layers as the spin-valve sensor 200 with the addition of the second pinning layer 502 adjacent to the third pinned layer 503. The third pinned layer 503 is adjacent to the second oxide layer 504. The second oxide layer 504 is adjacent to the fourth pinned layer 505. The fourth pinned layer 505 is adjacent to the second spacer layer 506. This new structure is sandwiched between the cap layer 501 (cap layer 201), and the free layer 507 (free layer 202).

Figure 6:
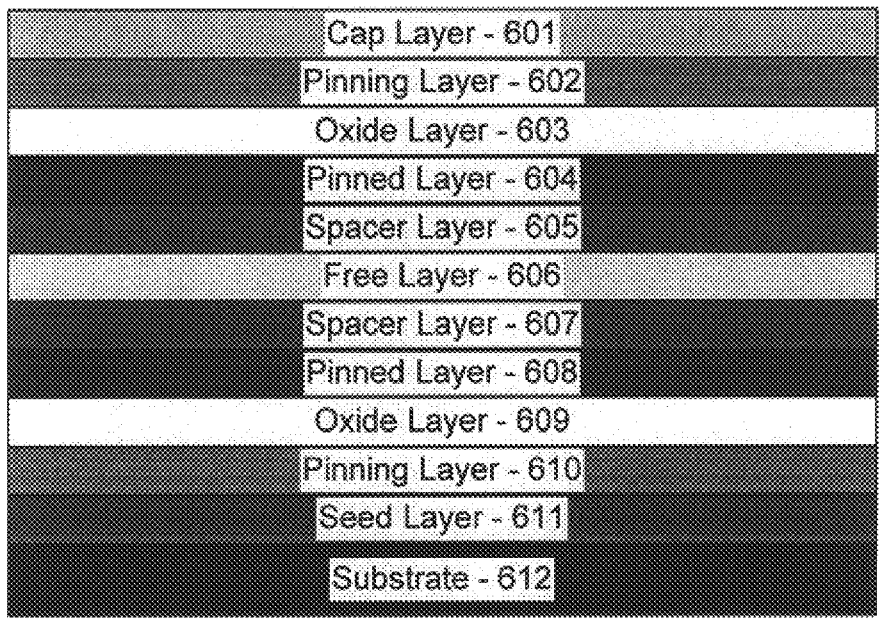
FIG. 6 is a dual spin-valve read sensor with a second oxide layer.

The simple dual spin-valve can also be achieved by using compound antiferromagnetic pinning layers as in FIG. 6. FIG. 6 shows a read head sensor illustrating an implementation of a dual spin-valve sensor with a compound antiferromagnetic pinning layer in accordance with the present invention. Spin-valve sensor 600 includes a cap layer 601, a second pinning layer 602, a second oxide layer 603, a second pinned layer 605, a second spacer layer 605, a free layer 606, a first spacer layer 607, a first pinned layer 608, a first oxide layer 609, a first pinning layer 610, a seed layer 611, and a substrate 612. The spin-valve 600 is comprised of substantially the same layers as the spin-valve sensor 100 with the addition of the second pinning layer 602 adjacent to the second oxide layer 603. The second oxide layer 603 adjacent to the second pinned layer 604. The second pinned layer 604 adjacent to the second spacer layer 605. This new structure is sandwiched between the cap layer [501] 601 (cap layer 101) and the free layer 606 (free layer 102).

Figure 7:
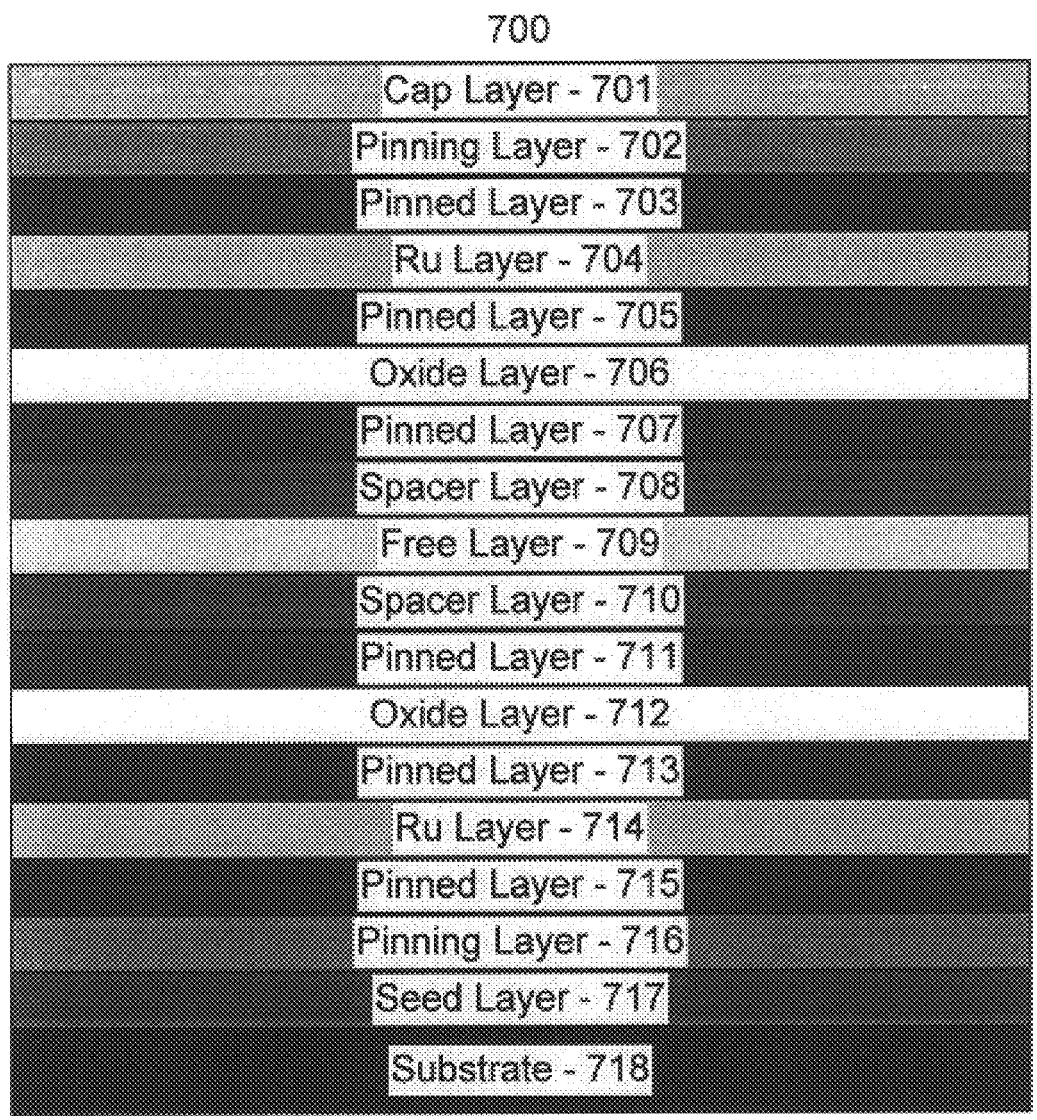
FIG. 7 is a dual spin-valve read sensor with a synthetic anti-ferromagnetic layer.

When using the dual spin-valve with synthetic antiferromagnetic pinned layers, the oxide layers need to be inserted inside the pinned layers next to the spacer layer for the same reason given above. FIG. 7 shows a read head sensor illustrating an implementation of a dual spin-valve sensor with synthetic antiferromagnetic pinned layers in accordance with the present invention. The sensor consists of a cap layer 701, a second pinning layer 702, a sixth pinned layer 703, a second Ru layer 704, a fifth pinned layer 705, a second oxide layer 706, a forth pinned layer 707, a second spacer layer 708, a free layer 709, a first spacer layer 710, a third pinned layer 711, a first oxide layer 712, a first pinned layer 713, a first Ru layer 714, a second pinned layer 715, a first pinning layer 716, a seed layer 717, and a substrate 718. The spin-valve 700 is comprised of substantially the same layers as the spin-valve sensor 400 with the addition of the second pinning layer 702 adjacent to the sixth pinned layer 703. The sixth pinned layer 703 adjacent to the second Ru layer 704. The second Ru layer 704 adjacent to the fifth pinned layer 705. The fifth pinned layer 705 adjacent to the second oxide layer 706. The second oxide layer 706 adjacent to the forth pinned layer 707. The forth pinned layer 707 adjacent to the second spacer layer 708. This new structure is sandwiched between the cap layer 701 (cap layer 401) and the free layer 709 (free layer 402).

In any of these implementations, the pinned layer can be of CoFe, NiFe, Co, or other suitable materials. Similarly, the free layer can be of CoFe, NiFe, Co, or other suitable materials. The spacer layer can be of Cu or other suitable materials. The pinning layer can be composed of either PtMn or NiMn. The use of either of these materials for the pinning layer can result in the sensor stack having a higher blocking temperature. The oxide layer can be formed using an antiferromagnetic oxide. Similarly, the cap layer can be formed using an oxide cap. The electron specular scattering effect occurs at the metal/oxide interfaces. The spin-valve layers sandwiched between the oxide layers form a conducting channel through which the electrons travel.

What is claimed is:

1. A magnetoresistive sensor comprising:
    an oxide layer comprising opposing first and second surfaces;
    a pinned layer comprising a first surface contacting the first surface of the oxide layer and a second surface contacting a first surface of a non-magnetic spacer;
    a free magnetic layer comprising a first surface separated from the pinned layer by the non-magnetic spacer;
    a pinning layer comprising a first surface separated from the pinned layer by the oxide layer; and
    a seed layer comprising a first surface contacting a second surface of the pinning layer and a second surface contacting a first surface of a substrate.

2. The sensor of claim 1 further comprising a second pinned layer comprising a first surface contacting the second surface of the oxide layer and a second surface contacting the first surface of the pinning layer.

3. The sensor of claim 2 further comprising:
    a second oxide layer comprising a first surface contacting the second surface of the free magnetic layer; and
    a second surface contacting a first surface of a second free layer.

4. The sensor of claim 2 further comprising:
    a second non-magnetic spacer comprising a first surface contacting a second surface of the free magnetic layer and a second surface contacting a first surface of a third pinned layer;
    a second oxide layer comprising a first surface contacting a second surface of a third pinned layer and a second surface contacting a first surface of a forth pinned layer; and
    a second pinning layer comprising a first surface contacting a second surface of the forth pinned layer.

5. The sensor of claim 1 further comprising:
    a second pinned layer comprising a first surface contacting the second surface of the oxide layer and a second surface contacting a first surface of a Ru layer; and
    a third pinned layer comprising a first surface contacting a second surface of the Ru layer and a second surface contacting the first surface of the pinning layer.

6. The sensor of claim 5 further comprising:
    a second non-magnetic spacer comprising a first surface contacting a second surface of the free magnetic layer and a second surface contacting a first surface of a forth pinned layer;
    a second oxide layer comprising a first surface contacting a second surface of the forth pinned layer and a second surface contacting a first surface of a fifth pinned layer;
    a second Ru layer comprising a first surface contacting a second surface of the fifth pinned layer and a second surface contacting a first surface of a sixth pinned layer; and
    a second pinning layer comprising a first surface contacting a second surface of the sixth pinned layer.

7. The sensor of claim 1 further comprising:
    a second non-magnetic spacer comprising a first surface contacting a second surface of the free magnetic layer and a second surface contacting a first surface of a second pinned layer; and
    a second oxide layer comprising a first surface contacting a second surface of the second pinned layer and a second surface contacting a first surface of a second pinning layer.

8. The sensor of claim 1 further comprising a cap layer comprising a first surface separated from the non-magnetic spacer by the free magnetic layer.

9. The sensor of claim 1 wherein the pinning layer comprises a material selected from the group consisting of NiMn and PtMn.

10. A method of manufacturing a magnetoresistive sensor comprising: forming a layer structure comprising:
    an oxide layer having opposing first and second surfaces;
    a pinned layer comprising a first surface contacting the first surface of the oxide layer and a second surface contacting a first surface of a non-magnetic spacer;
    a free magnetic layer comprising a first surface separated from the pinned layer by the non-magnetic spacer;
    a pinning layer comprising a first surface separated from the pinned layer by the oxide layer; and
    a seed layer comprising a first surface contacting a second surface of the pinning layer and a second surface contacting a first surface of a substrate.

11. The method of claim 10 wherein the layer structure further comprises a second pinned layer comprising a first surface contacting the second surface of the oxide layer and a second surface contacting the first surface of the pinning layer.

12. The method of claim 11 wherein the layer structure further comprises:
    a second oxide layer comprising a first surface contacting the second surface of the free magnetic layer; and
    a second surface contacting a first surface of a second free magnetic layer.

13. A method of claim 11 wherein the layer structure further comprises:
    a second non-magnetic spacer comprising a first surface contacting a second surface of the free magnetic layer and a second surface contacting a first surface of a third pinned layer;
    a second oxide layer comprising a first surface contacting a second surface of a third pinned layer and a second surface contacting a first surface of a forth pinned layer; and
    a second pinning layer comprising a first surface contacting a second surface of the forth pinned layer.

14. The method of claim 10 wherein the layer structure further comprises:
- a second pinned layer comprising a first surface contacting the second surface of the oxide layer and a second surface contacting a first surface of a Ru layer; and
- a third pinned layer comprising a first surface contacting a second surface of the Ru layer and a second surface contacting the first surface of the pinning layer.

15. A method of claim 14 wherein the layer structure further comprises:
- a second non-magnetic spacer comprising a first surface contacting a second surface of the free magnetic layer and a second surface contacting a first surface of a forth pinned layer;
- a second oxide layer comprising a first surface contacting a second surface of the forth pinned layer and a second surface contacting a first surface of a fifth pinned layer;
- a second Ru layer comprising a first surface contacting a second surface of the fifth pinned layer, and a second surface contacting a first surface of a sixth pinned layer; and
- a second pinning layer comprising a first surface contacting a second surface of the sixth pinned layer.

16. A method of claim 10 wherein the layer structure further comprises:
- a second non-magnetic spacer comprising a first surface contacting the second surface of the free magnetic layer and a second surface contacting a first surface of a second pinned layer; and
- a second oxide layer comprising a first surface contacting a second surface of the second pinned layer and a second surface contacting a first surface of a second pinning layer.

17. A method of claim 10 wherein the layer structure further comprises a cap layer comprising a first surface separated from the non-magnetic spacer by the free non-magnetic layer.

18. A magnetoresistive sensor comprising:
- a specular reflection layer comprising opposing first and second surfaces;
- a pinned layer comprising a first surface contacting the first surface of the specular reflection layer and a second surface contacting a first surface of a non-magnetic spacer;
- a free magnetic layer comprising a first surface separated from the pinned layer by the non-magnetic spacer;
- a pinning layer comprising a first surface separated from the pinned layer by the specular reflection; and
- a seed layer positioned between the pinning layer and a substrate layer.

19. The sensor of claim 18 further comprising a second pinned layer comprising a first surface contacting the second surface of the specular reflection layer and a second surface contacting the first surface of the pinning layer.

20. The sensor of claim 19 further comprising a second specular reflection layer comprising a first surface and a second surface, wherein the first surface is contacting the second surface of the free magnetic layer and the second surface is contacting a first surface of a second free layer.

21. The sensor of claim 19 further comprising:
- a second non-magnetic spacer comprising a first surface contacting a second surface of the free magnetic layer and a second surface contacting a first surface of a third pinned layer;
- a second specular reflection layer comprising a first surface contacting a second surface of a third pinned layer and a second surface contacting a first surface of a fourth pinned layer;
- a second pinning layer comprising a first surface contacting a second surface fourth pinned layer.

22. The sensor of claim 18 further comprising:
- a second pinned layer comprising a first surface contacting the second surface of the specular reflection layer and a second surface contacting a first surface of a Ru layer; and
- a third pinned layer comprising a first surface contacting a second surface of the Ru layer and a second surface contacting the first surface of the pinning layer.

23. The sensor of claim 22 further comprising:
- a second non-magnetic spacer comprising a first surface contacting a second of the free magnetic layer and a second surface contacting a first surface of a fourth pinned layer;
- a second specular reflection layer comprising a first surface contacting a second surface of the fourth pinned layer and a second surface contacting a first surface of a fifth pinned layer;
- a second Ru layer comprising a first surface contacting a second surface of the fifth pinned layer and a second surface contacting a first surface of a sixth pinned layer; and
- a second pinning layer comprising a first surface contacting a second surface of the sixth pinned layer.

24. The sensor of claim 18 further comprising:
- a second non-magnetic spacer comprising a first surface contacting a second surface of the free magnetic layer and a second surface contacting a first surface of a second pinned layer; and
- a second specular reflection layer comprising a first surface contacting a second surface of the second pinned layer and a second surface contacting a first surface of a second pinning layer.

25. The sensor of claim 18 further comprising a cap layer comprising a first surface separated from the non-magnetic spacer by the free magnetic layer.

26. The sensor of claim 18 wherein the pinning layer comprises a material selected from the group consisting of NiMn and PtMn.

* * * * *